United States Patent
Ohta et al.

(10) Patent No.: US 10,895,473 B2
(45) Date of Patent: Jan. 19, 2021

(54) MAGNETORESISTIVE EFFECT ELEMENT, MANUFACTURING METHOD THEREOF, AND POSITION DETECTION APPARATUS

(71) Applicant: TDK Corporation, Tokyo (JP)

(72) Inventors: Naoki Ohta, Tokyo (JP); Takayasu Kanaya, Tokyo (JP)

(73) Assignee: TDK Corporation, Tokyo (JP)

( * ) Notice: Subject to any disclaimer, the term of this patent is extended or adjusted under 35 U.S.C. 154(b) by 183 days.

(21) Appl. No.: 16/049,981

(22) Filed: Jul. 31, 2018

(65) Prior Publication Data

US 2019/0285435 A1  Sep. 19, 2019

(30) Foreign Application Priority Data

Mar. 16, 2018 (JP) .................................. 2018-49267

(51) Int. Cl.
*G01D 5/16* (2006.01)

(52) U.S. Cl.
CPC ...................... *G01D 5/16* (2013.01)

(58) Field of Classification Search
CPC ........ G01D 5/16; G01D 5/245; G01D 5/2451; G01D 5/485; G01R 33/06; G01R 33/093; G01R 15/20; G01R 15/205; G01R 33/035; G11B 5/39; G11B 5/3906; G11B 2005/0016; G11B 2005/3996; H01L 43/08; H01F 10/3259; H01F 10/3272; H01F 41/325
See application file for complete search history.

(56) References Cited

U.S. PATENT DOCUMENTS

| 10,416,000 B2 | 9/2019 | Ohta | |
|---|---|---|---|
| 2008/0055788 A1 | 3/2008 | Nagai | |
| 2011/0025320 A1 | 2/2011 | Ohta et al. | |
| 2011/0068786 A1* | 3/2011 | Ohta | G01R 33/093 324/252 |
| 2015/0145504 A1* | 5/2015 | Bai | G01P 3/488 324/207.13 |
| 2015/0268105 A1* | 9/2015 | Fuji | G01L 9/16 73/779 |
| 2018/0172781 A1 | 6/2018 | Ohta et al. | |

FOREIGN PATENT DOCUMENTS

| DE | 10 2017 123 789 A1 | 6/2018 |
|---|---|---|
| JP | H09-044820 A | 2/1997 |
| JP | 2008-59705 A | 3/2008 |
| JP | 2008-186506 A | 8/2008 |

(Continued)

OTHER PUBLICATIONS

Office Action dated Jun. 21, 2019 issued in corresponding DE patent application No. 10 2018 120 127.3 (English translation only).

*Primary Examiner* — Son T Le
(74) *Attorney, Agent, or Firm* — Posz Law Group, PLC (57) ABSTRACT

The magnetoresistive effect element is provided with a plurality of magnetoresistive effect laminated bodies, a plurality of lower lead electrodes and upper lead electrodes that electrically connect the plurality of magnetoresistive effect laminated bodies in series, and a film that electrically connects the plurality of lower lead electrodes to each other so that none of the plurality of lower lead electrodes is electrically isolated.

11 Claims, 6 Drawing Sheets

(56) References Cited

FOREIGN PATENT DOCUMENTS

| | | |
|---|---|---|
| JP | 2009-16492 A | 1/2009 |
| JP | 2009-042105 A | 2/2009 |
| JP | 2010-256366 A | 11/2010 |
| JP | 2011-47928 A | 3/2011 |
| JP | 6280610 B1 | 2/2018 |

\* cited by examiner

MAGNETORESISTIVE EFFECT ELEMENT, MANUFACTURING METHOD THEREOF, AND POSITION DETECTION APPARATUS

CROSS REFERENCE TO RELATED APPLICATIONS

The present application is based on Japanese Patent Application No. 2018-49267 filed on Mar. 16, 2018, the disclosure of which is incorporated herein by reference.

TECHNICAL FIELD

The present invention relates to a magnetoresistive effect element and a manufacturing method thereof, and a position detection apparatus having the magnetoresistive effect element.

BACKGROUND ART

Conventionally, in machine tools or the like, position detection apparatus for detecting the position and/or the amount of movement (the amount of change) of a moving body due to rotative movement or linear movement are used. Among such position detection apparatus, those provided with a magnetic sensor that is capable of detecting change in the external magnetic field in association with movement of the moving body are known. The magnetic sensor outputs a signal that indicates the relative positional relationship between the moving body and the magnetic sensor.

Among the magnetic sensors that are used in such position detection apparatus, those provided with a magnetoresistive effect element (a TMR element) that is a laminated body having a free layer and a magnetization-fixed layer and of which the resistance changes in association with change in the magnetization direction of the free layer in accordance with the external magnetic field are known.

Figure 10:
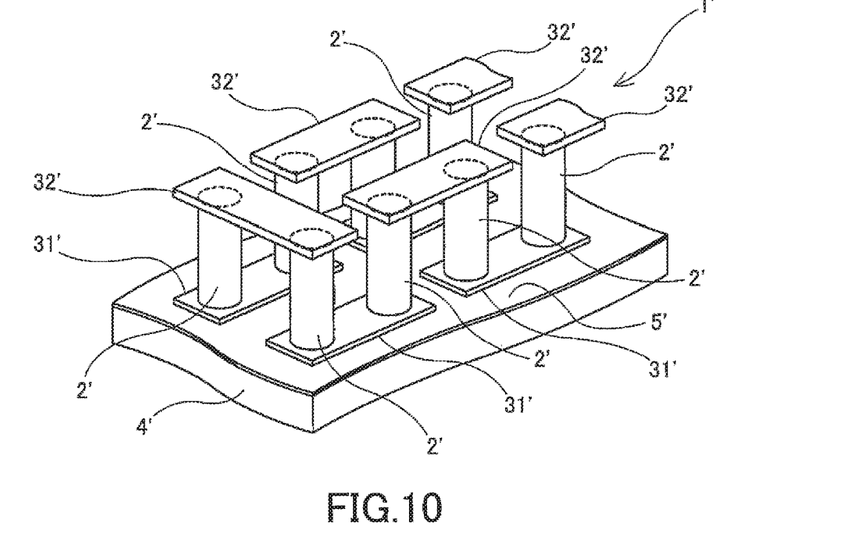
FIG. 10 is a perspective view showing the schematic configuration of the conventional magnetoresistive effect element.

The TMR element includes a plurality of magnetoresistive effect laminated bodies (TMR laminated bodies) connected in series. The TMR laminated bodies have low electro-static discharge (ESD) resistance and may break down when an excess voltage is applied or an excess current flows due to surge of static electricity or the like. Therefore, for reducing the voltage that is applied to an individual TMR laminated body and improving the ESD resistance, a plurality of TMR laminated bodies 2' is connected in series via lower lead electrodes 31' and upper lead electrodes 32' in a TMR element 1' (see FIG. 10).

PRIOR ART DOCUMENT

Patent Document

[Patent Document 1] Japanese Unexamined Patent Application Publication No. 2011-47928.

SUMMARY OF THE INVENTION

Problem to be Solved by the Invention

Figure 11A:
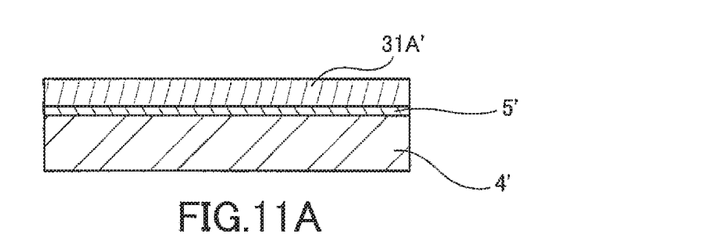
FIGS. 11A to 11C are process flow diagrams showing in cross-sectional end views the steps of manufacturing the lower lead electrodes in the conventional magnetoresistive effect element.
Figure 11B:
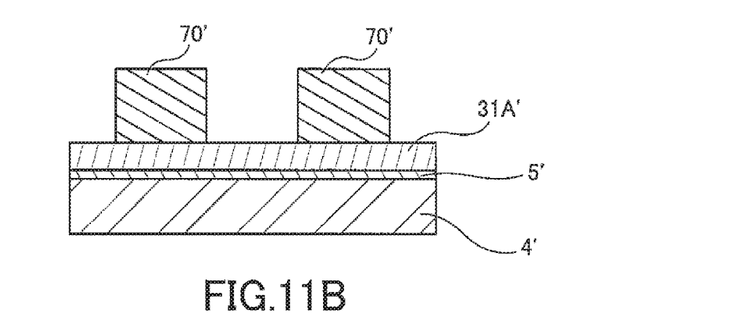

The lower lead electrodes 31' in the above TMR element are manufactured, for example, as follows. First, a base insulating film 5' consisting of $Al_2O_3$ or the like is formed on a semiconductor substrate 4' (see FIG. 11A), A lower lead film 31A' (for example, a metallic laminated film such as Ta/Cu/Ta) for forming the lower lead electrodes 31' is formed on the base insulating film 5' (see FIG. 11B). A resist pattern 70' corresponding to the lower lead electrodes 31' is formed on the lower lead film 31A', and the lower lead electrodes 31' are formed by milling with ion beam emission (see FIG. 11C). The lower lead film 31A', in areas other than the lower lead electrodes 31', is milled to expose the base insulating film 5'. In other words, each of a plurality of lower lead electrodes 31' is formed in an electrically isolated manner.

Figure 11C:
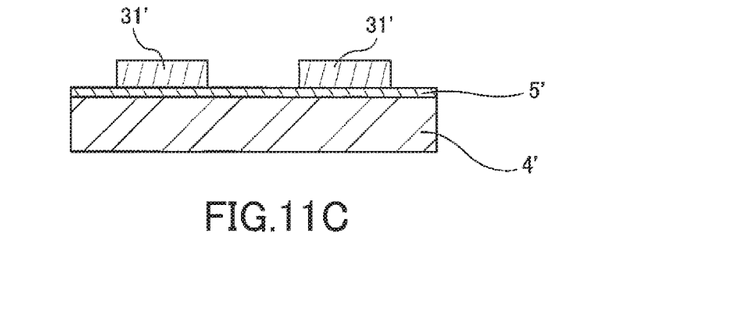

An ion beam, which is used for the milling, is usually irradiated after being electrically neutralized by a neutralizing device that is provided near the irradiation hole of an ion bean gun. However, an ion beam with unbalanced charge may be irradiated under the influence of dirt or the like inside the chamber of the ion beam milling device. Consequently, the semiconductor substrate 4' and/or the base insulating film 5' directly below the lower lead electrodes 31' may locally be charged.

When a conductive film for forming the TMR laminated bodies on the lower lead electrodes 31 is formed after forming the lower lead electrodes 31', charges are released from the charged semiconductor 4' and/or base insulating film 5' via the lower lead electrodes 31' and the conductive film. At that time, traces of discharge are formed on the lower lead electrodes 31'.

With the view of the above problem, the present invention aims to provide a magnetoresistive effect element that includes the lower lead electrodes with no traces of discharge, a manufacturing method thereof, and a position detection apparatus having the magnetoresistive effect element.

Problem Solution Means

To solve the above problem, the present invention provides a magnetoresistive effect element that includes a magnetoresistive effect laminated body, a lower lead electrode and an upper lead electrode for supplying a current to the magnetoresistive effect laminated body, and a film that electrically connects the lower lead electrode to another conductive body.

In the above magnetoresistive effect element, the magnetoresistive effect element includes a plurality of the magnetoresistive effect laminated bodies, a plurality of the lower lead electrodes, a plurality of the upper lead electrodes, which electrically connects the plurality of magnetoresistive effect laminated bodies in series, wherein the film electrically connects the plurality of lower lead electrodes to each other.

In the above magnetoresistive effect element, the plurality of lower lead electrodes may be electrically connected to substantially the entire surface via the film. The lower lead electrode is a laminated body in which at least a first conductive layer and a second conductive layer are laminated in this order, and the film may include the same type of conductive material as the first conductive layer and can include an oxide of the same type of conductive material as the first conductive layer. The resistance value of the film may be higher than the resistance value of the magnetoresistive effect laminated body, and a TMR laminated body can be used as the magnetoresistive effect laminated body.

The present invention provides a position detection apparatus having a magnetic sensor part that outputs a sensor signal based on changes in an external magnetic field in association with movements of a moving body, and a position detection part that detects the position of the moving body based on the sensor signal that is output by the magnetic sensor part, wherein the magnetic sensor part includes the above magnetoresistive effect element.

In the above position detection apparatus, it is preferable that the moving body is a rotating moving body that rotates about a predetermined rotation axis, and the position detection part detects the rotational position of the rotating moving body based on the sensor signal that is output by the magnetic sensor part.

The present invention provides a method of manufacturing a magnetoresistive effect element having a magnetoresistive effect laminated body, and a lower lead electrode and an upper lead electrode for supplying a current to the magnetoresistive effect laminated body wherein the lower lead electrode is a laminated body in which at least a first conductive layer and a second conductive layer are laminated in this order, including a step of forming a first conductive film consisting of a first conductive material to configure the first conductive layer, a step of forming on the first conductive film a second conductive film consisting of a second conductive material to configure the second conductive layer, a step of forming the lower lead electrode in a lower lead electrode formation area by milling a laminated film in which at least the first conductive film and the second conductive film are laminated, a step of forming the magnetoresistive effect laminated body in a magnetoresistive effect laminated body formation area that is set on the lower lead electrode, and a step of forming an upper lead electrode on the magnetoresistive effect laminated body that is formed in the magnetoresistive effect laminated body formation area, wherein in the step of forming the lower lead electrode, the laminated film is milled so that at least a part of the first conductive film is left in areas other than the lower lead electrode formation area, whereby a film that electrically connects the lower lead electrode to another conductive body is formed.

In the above manufacturing method, the magnetoresistive effect element has a plurality of the magnetoresistive effect laminated bodies, and a plurality of the lower lead electrodes and a plurality of the upper lead electrodes that electrically connect the plurality of magnetoresistive effect laminated bodies in series, the magnetoresistive effect laminated body is formed in each of a plurality of the magnetoresistive effect laminated body formation areas that are set on each of the plurality of lower lead electrodes in the step of forming the magnetoresistive effect laminated body, the plurality of upper lead electrodes are formed so that the plurality of magnetoresistive effect laminated bodies are connected in the step of forming the upper lead electrode in series, and the laminated film is milled so that at least a part of the first conductive film is left in areas other than the lower lead electrode formation areas, whereby the film that electrically connects the plurality of lower lead electrodes to each other can be formed in the step of forming the lower lead electrode.

Efficacy of the Invention

The present invention can provide a magnetoresistive effect element that includes the lower lead electrodes with no discharge traces, a manufacturing method thereof, and a position detection apparatus having the magnetoresistive effect element.

MODE FOR IMPLEMENTING THE INVENTION

Figure 1:
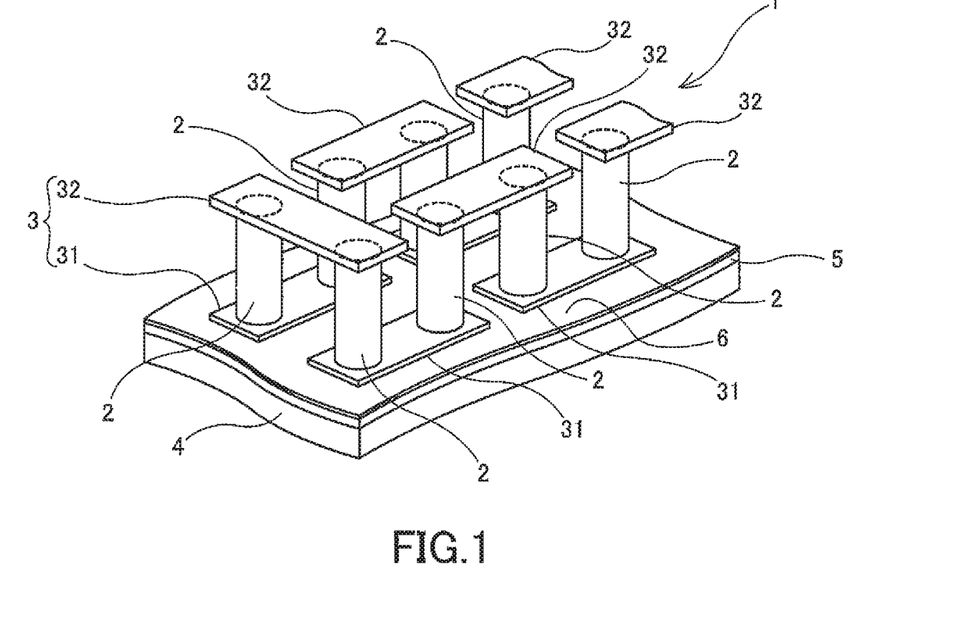
FIG. 1 is a perspective view showing the schematic configuration of the magnetoresistive effect element according to an embodiment of the present invention.
Figure 2:
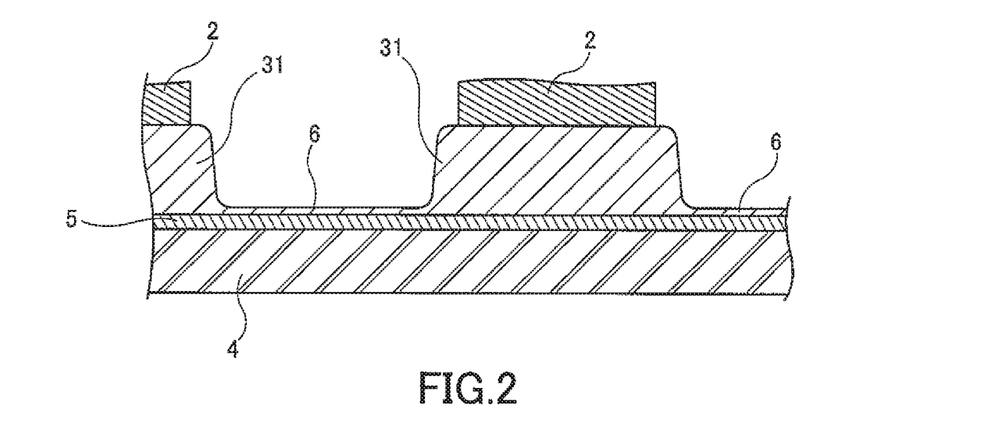
FIG. 2 is a partial enlarged cross-sectional view showing the schematic configuration of the core part of the magnetoresistive effect element according to an embodiment of the present invention.
Figure 3:
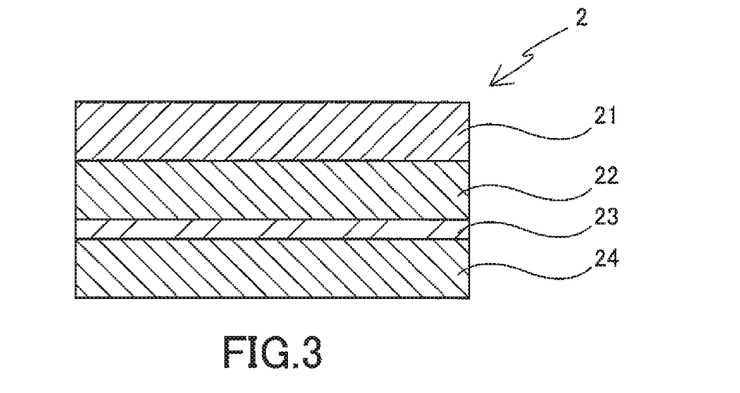
FIG. 3 is a cross-sectional view showing the schematic configuration of the magnetoresistive effect laminated body in an embodiment of the present invention.

An embodiment of the present invention will be described with reference to the drawings. FIG. 1 is a perspective view showing the schematic configuration of the magnetoresistive effect element according to this embodiment. FIG. 2 is a partial enlarged cross-sectional view showing the schematic configuration of the core part of the magnetoresistive effect element according to this embodiment. FIG. 3 is a cross-sectional view showing the schematic configuration of the magnetoresistive effect laminated body in this embodiment.

As shown in FIGS. 1 to 3, a magnetoresistive effect element 1 according to this embodiment is provided with a plurality of magnetoresistive effect laminated bodies 2 that is arranged in an array and a plurality of lead electrodes 3 for electrically connecting the plurality of magnetoresistive effect laminated bodies 2 in series.

Specifically, the magnetoresistive effect element 1 has a plurality of lower lead electrodes 31, a plurality of magnetoresistive effect laminated bodies 2, and a plurality of upper lead electrodes 32. The lower lead electrodes 31 and the upper lead electrodes 32 can be configured by, for example, a laminated film consisting of one conductive material or two or more conductive materials among Cu, Al, Au, Ta, Ti, and the like. The lower lead electrodes 31 and the upper lead electrodes 32 each have a thickness of 0.3 to 2.0 µm or so. For example, the lower lead electrodes 31 can be configured by a three-layer laminated body of Ta/Cu/Ta.

The plurality of lower lead electrodes 31 is provided on a semiconductor substrate 4 with a base insulating film 5 consisting of $Al_2O_3$ or the like in-between. Each of the plurality of lower lead electrodes 31 has an elongated, nearly rectangular shape and is provided so that there is a predetermined space between two adjacent lower lead electrodes 31 in the electrical serial direction of the plurality of magnetoresistive effect laminated bodies 2, which is arranged in an array. The magnetoresistive effect laminated bodies 2 are provided near each of the longitudinal ends of the lower lead electrodes 31. In other words, two magnetoresistive effect laminated bodies 2 are provided on each of the plurality of lower lead electrodes 31.

In this embodiment, each lower lead electrodes 31 is electrically connected via an antistatic film (conductive film) 6, and when looking at only the lower lead electrodes 31, none of the plurality of lower lead electrodes 31 is electrically isolated. As described later, the antistatic film (conductive film) 6 can be formed by leaving a lower lead film 31A as a thin film while milling the lower lead film 31A when the lower lead electrodes 31 (see FIG. 4C) is formed. As a result, it is possible to prevent the base insulating film 5 and/or the semiconductor substrate 4 directly below the lower lead electrodes 31 from being charged and prevent occurrence of discharge traces when a conductive film is formed on the lower lead electrodes 31. Therefore, the magnetoresistive effect element 1 according to this embodiment has the lower lead electrodes 31 with no discharge traces.

The antistatic film (conductive film) 6 includes the same type of conductive material as the conductive material to configure the lowest layer (closest to the base insulating film 5) of the lower lead electrodes 31 among the conductive materials to configure the lower lead electrodes 31, and preferably includes an oxide of that conductive material. As the antistatic film (conductive film) 6 includes an oxide of that conductive material, the antistatic film (conductive film) 6 can have a higher resistance value. For example, when the lower lead electrodes 31 consist of a three-layer laminated film of Ta/Cu/Ta, the antistatic film (conductive film) 6 includes Ta and an oxide of Ta ($TaO_x$, X=0.1 to 1.5), and the surface of the antistatic film (conductive film) 6 is rich in the Ta oxide.

The thickness of the antistatic film (conductive film) 6 is not particularly restricted and can be set as appropriate as long as the antistatic film (conductive film) 6 can prevent the substrate 4 and/or the base insulating film 5 directly below the lower lead electrodes 31 from being locally charged and prevent short circuit current from flowing between the lower lead electrodes 31. The thickness of the antistatic film (conductive film) 6 means the arithmetic average value of the thicknesses that are measured at multiple points (for example, five points) that are selected on an arbitrary basis, and can be set to, for example, 10 to 50 Å or so.

The antistatic film (conductive film) 6 may be formed so that every lower lead electrode 31 is not electrically isolated when only the lower lead electrode 31 is viewed. The antistatic film (conductive film) 6 may be formed on the entire surface of the base insulating film 5 excluding the areas where the lower lead electrodes 31 are formed or formed only in a partial area of the base insulating film 5.

The magnetoresistive effect laminated bodies 2 in this embodiment are TMR elements and, as shown in FIG. 3, have a magnetization-fixed layer 22 of which the magnetization direction is fixed, a free layer 24, of which the magnetization direction changes according to the direction of the applied magnetic field, a non-magnetic layer 23 that is between the magnetization-fixed layer 22 and the free layer 24, and an antiferromagnetic layer 21.

The magnetoresistive effect laminated bodies 2 have a structure in which the free layer 24, the non-magnetic layer 23, the magnetization-fixed layer 22, and the antiferromagnetic layer 21 are laminated in this order from the lower lead electrodes 31. The free layer 24 is electrically connected to the lower lead electrodes 31, and the antiferromagnetic layer 21 is electrically connected to the upper lead electrodes 32. Materials to configure the free layer 24 and the magnetization-fixed layer 22 include, for example, NiFe, CoFe, CoFeB, CoFeNi, $Co_2MnSi$, $Co_2MnGe$, $FeO_x$ (oxides of Fe), and the like. The free layer 24 and the magnetization-fixed layer 22 each have a thickness of approximately 1 to 10 nm.

The non-magnetic layer 23 is a tunnel bather layer and a film that is essential for the magnetoresistive effect laminated bodies 2 in this embodiment to realize the tunnel magnetoresistive effect (the TMR effect). Materials to configure the non-magnetic layer 23 include, for example, Cu, Au, Ag, Zn, Ga, TiOx, ZnO, InO, SnO, GaN, ITO (Indium Tin Oxide), $Al_2O_3$, MgO, and the like. The non-magnetic layer 23 may be configured by a laminated film of two or more layers. For example, the non-magnetic layer 23 may be configured by a three-layer laminated film of Cu/ZnO/Cu or a three-layer laminated film of Cu/ZnO/Zn in which one Cu is substituted by Zn. Here, the thickness of the non-magnetic layer 23 is approximately 0.1 to 5 nm.

The antiferromagnetic layer 21 is configured by an antiferromagnetic material including, for example, at least one element that is selected from a group of Pt, Ru, Rh, Pd, Ni, Cu, Ir, Cr, and Fe, and Mn. The content of Mn in this antiferromagnetic material is, for example, approximately 35 to 95 atomic %. The antiferromagnetic layer 21 that is configured by an antiferromagnetic material plays the role of fixing the magnetization direction of the magnetization-fixed layer 22 by exchange-coupling with the magnetization-fixed layer 22.

The plurality of upper lead electrodes 32 is provided on the plurality of magnetoresistive effect laminated bodies 2. Each upper lead electrode 32 has an elongated, nearly rectangular shape. The upper lead electrodes 32 are arranged so that there is a predetermined space between two adjacent upper lead electrodes 32 in the electrically serial direction of the plurality of arrayed magnetoresistive effect laminated bodies 2, and the plurality of magnetoresistive effect laminated bodies 2 is connected in series, whereby the antiferromagnetic layers 21 of two adjacent magnetoresistive effect laminated bodies 2 are electrically connected to each other. Here, the magnetoresistive effect laminated bodies 2 may have a configuration in which the antiferromagnetic layer 21, the magnetization-fixed layer 22, the non-magnetic layer 23, and the free layer 24 are laminated in this order from the lower lead electrodes 31. Moreover, a cap layer (a protective layer) may be provided between the free layer 24 and the lower lead electrodes 31 or the upper lead electrodes 32.

In the magnetoresistive effect laminated bodies 2 in this embodiment, the resistance value changes according to the angle of the magnetization direction of the free layer 24 with respect to the magnetization direction of the magnetization-fixed layer 22, and the resistance value is minimized when this angle is 0° (their magnetization directions are parallel to each other) and maximized when this angle is 180° (their magnetization directions are parallel and opposite to each other).

Figure 4A:
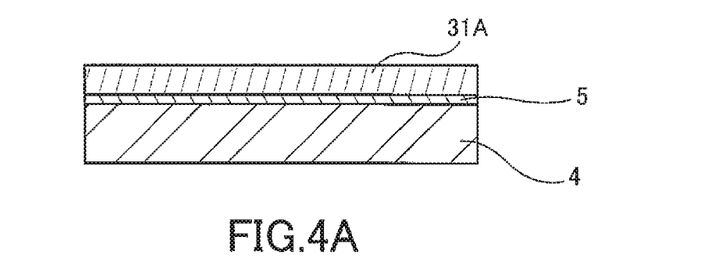
FIGS. 4A to 4C are process flow diagrams showing in cross-sectional end views the steps of the method of manufacturing the magnetoresistive effect element according to an embodiment of the present invention.
Figure 4B:
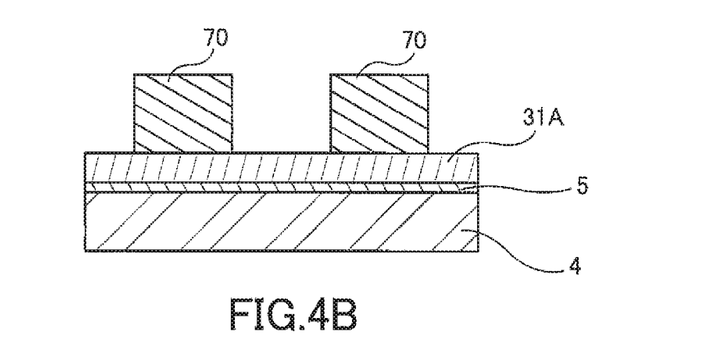
Figure 4C:
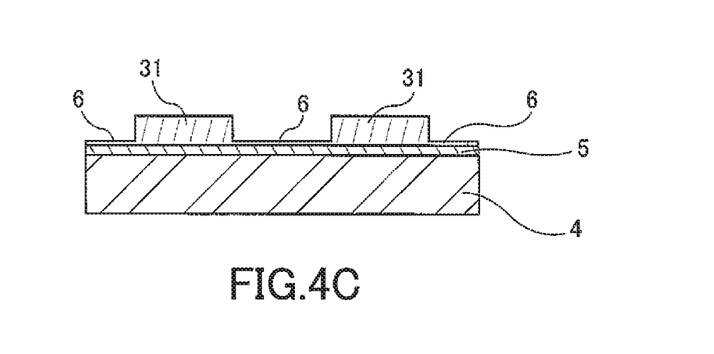
Figure 5A:
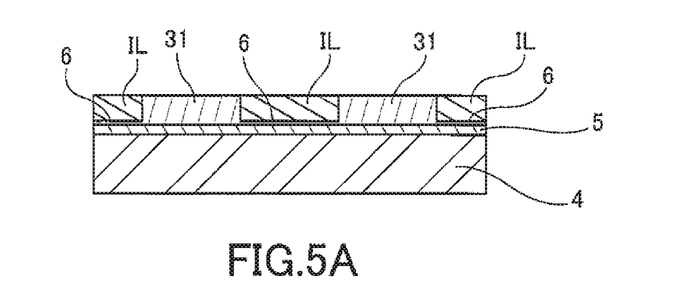
FIGS. 5A to 5C are process flow diagrams showing in cross-sectional end views the steps of the method of manufacturing the magnetoresistive effect element according to an embodiment of the present invention.
Figure 5B:
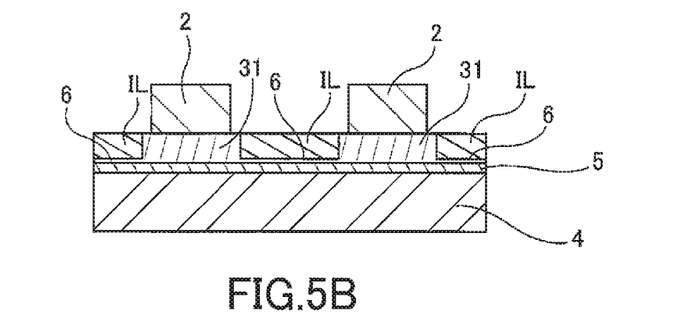
Figure 5C:
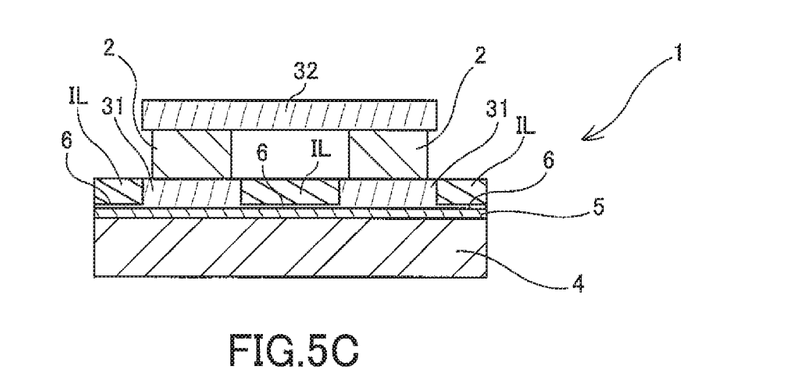

The method of manufacturing the magnetoresistive effect element 1 having the above configuration will be described. FIGS. 4 and 5 are process flow diagrams showing in cross-sectional end views the steps of manufacturing the magnetoresistive effect element 1 according to this embodiment.

After the base insulating film 5 of $Al_2O_3$ or the like is formed on the semiconductor substrate 4 by sputtering, the lower lead film 31A is formed by sputtering or the like (see FIG. 4A). For example, a Ta film, a Cu film, and a Ta film are formed by sputtering or the like in this order to form the lower lead film 31A. Next, the resist pattern 70 corresponding to the plurality of lower lead electrodes 31 is formed through a photolithography step (see FIG. 4B). Then, the plurality of lower lead electrodes 31 is formed by milling using the resist pattern 70 as the mask (see FIG. 4C).

In the milling to form the lower lead electrode 31, an ion beam is irradiated to the extent that the lower lead film 31A, in the area where the resist pattern 70 is absent, is not completely removed, more specifically, so that the lower lead film 31A remains with a thickness of approximately 7 to 20 Å. As a result, the antistatic film (conductive film) 6 that electrically connects the lower lead electrodes 31 to each other so that none of the plurality of lower lead electrodes 31 is electrically isolated can be formed. Consequently, it is possible to prevent the base insulating film 5 and/or the semiconductor substrate 4 directly below the lower lead electrodes 31 from being charged even if the ion beam that is irradiated in the milling is not completely neutralized. Here, an oxide layer of a conductive material (for example, Ta) is formed on the surface of the formed antistatic film (conductive film) 6 by natural oxidation. As just stated, as an oxide layer of a conductive material (for example, a $TaO_x$ layer, X=0.1 to 1.5) is formed on the surface of the antistatic film (conductive film) 6, it is possible to make the resistance value of the antistatic film (conductive film) 6 relatively high and effectively suppress short circuit current flow between the lower lead electrodes 31.

Next, an insulating layer IL of $Al_2O_3$ or the like is formed on the antistatic film (conductive film) 6, and a magnetoresistive effect film (for example, a laminated film in which a ferromagnetic film, a non-magnetic film, a ferromagnetic film, and an antiferromagnetic film are laminated in this order) is formed by sputtering or the like to cover the plurality of lower lead electrodes 31 (see FIG. 5A). In this embodiment, the antistatic film (conductive film) 6 does not allow the plurality of lower lead electrodes 31 to be electrically isolated and suppresses local charging of the base insulating film 5 and/or the semiconductor substrate 4 directly below them, whereby it is possible to prevent discharge traces from being formed when the magnetoresistive effect film is formed. Subsequently, the magnetoresistive effect laminated bodies 2 are formed in predetermined areas of each of the plurality of lower lead electrodes 31 through a photolithography step (see FIG. 5B).

Subsequently, an upper lead film is formed by sputtering or the like on the plurality of magnetoresistive effect laminated bodies 2 formed on the lower lead electrodes 31, and the upper lead electrodes 32 that connects the multiple magnetoresistive effect laminated bodies 2 in series are formed through a photolithography step (see FIG. 5C). In this way, the magnetoresistive effect element 1 according to this embodiment can be manufactured.

As stated above, according to this embodiment, the antistatic film (conductive film) 6 that electrically connects the lower lead electrodes 31 to each other is formed; therefore, when looking at only the lower lead electrode 31, the antistatic film (conductive film) 6 does not allow the multiple lower lead electrodes 31 to be electrically isolated and suppresses local charging of the base insulating film 5 and/or the semiconductor substrate 4 directly below them, whereby it is possible to prevent discharge traces from being formed when the magnetoresistive effect film 20 is formed. Moreover, since the antistatic film (conductive film) 6 is formed to have a very small thickness (approximately 10 to 50 Å) and has an extremely high resistance value compared with the resistance value of the magnetoresistive effect laminated bodies 2, the function of the magnetoresistive effect element 1 (change in the resistance value of the magnetoresistive effect laminated bodies 2 due to the external magnetic field) is not affected.

Figure 6:
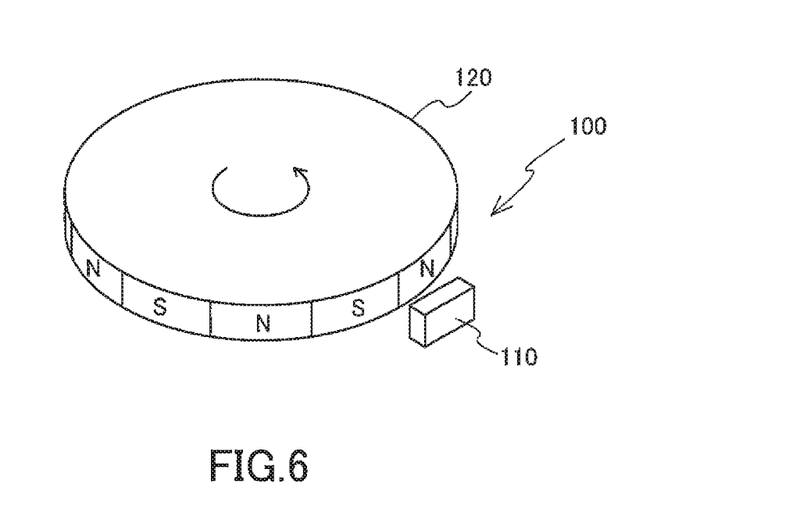
FIG. 6 is a perspective view showing the schematic configuration of the position detection apparatus in an embodiment of the present invention.
Figure 7:
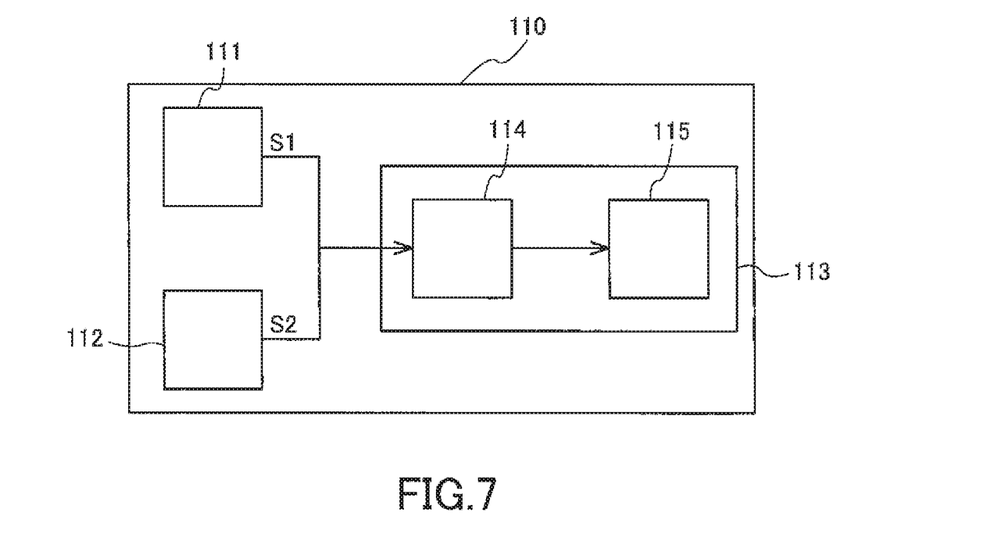
FIG. 7 is a block diagram showing the schematic configuration of the magnetic sensor in an embodiment of the present invention.
Figure 8:
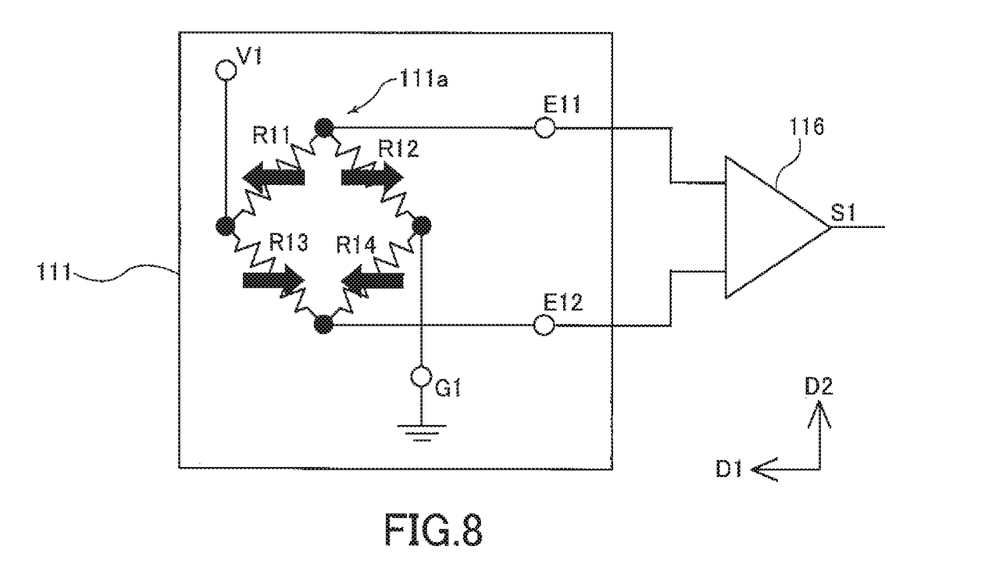
FIG. 8 is a circuit diagram schematically showing the circuit configuration of the first magnetic sensor part in an embodiment of the present invention.
Figure 9:
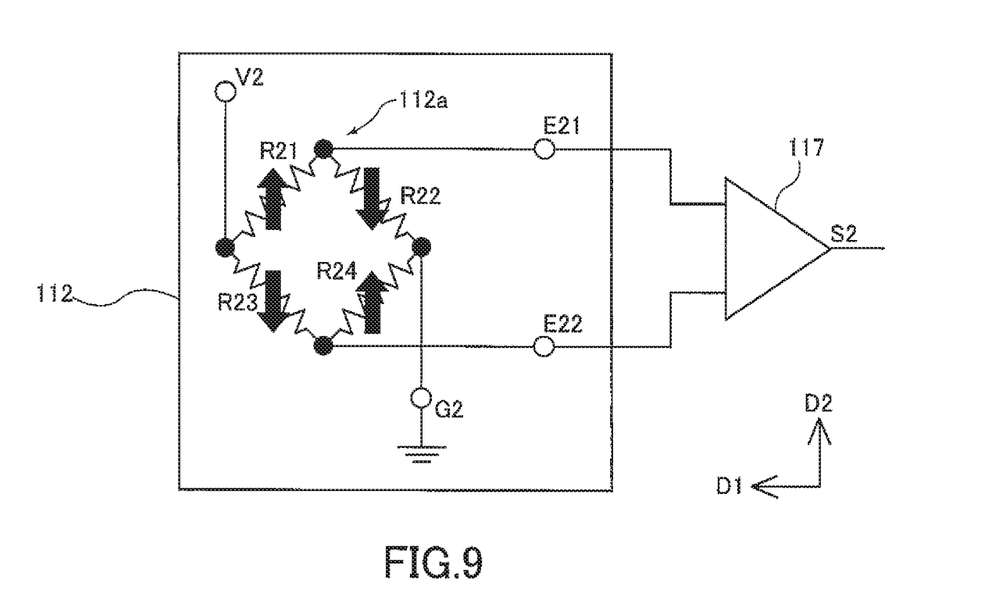
FIG. 9 is a circuit diagram schematically showing the circuit configuration of the second magnetic sensor part in an embodiment of the present invention.

Subsequently, a position detection apparatus using the magnetoresistive effect element 1 according to this embodiment will be described. FIG. 6 is a perspective view showing the schematic configuration of the position detection apparatus in this embodiment. FIG. 7 is a block diagram showing the schematic configuration of the magnetic sensor in this embodiment. FIG. 8 is a circuit diagram schematically showing the circuit configuration of the first magnetic sensor part in this embodiment. FIG. 9 is a circuit diagram schematically showing the circuit configuration of the second magnetic sensor part in this embodiment.

As shown in FIG. 6, a position detection apparatus 100 in this embodiment is provided with a magnetic sensor 110 and a moving body 120 that can move relatively with respect to the magnetic sensor 110. Here, in this embodiment, as a position detection apparatus, a rotary encoder provided with a rotating moving body 120 that rotates and moves about a predetermined rotation axis is described as an example. However, this mode is not restrictive. It may be a linear encoder provided with a moving body 120 that linearly moves in a predetermined direction relatively with respect to the magnetic sensor 110. Here, in the mode shown in FIG. 6, the rotating moving body 120 is a rotary magnet in which N poles and S poles are alternately magnetized on the out periphery.

As shown in FIG. 7, the magnetic sensor 110 has a first magnetic sensor part 111 and a second magnetic sensor part 112 that output sensor signals based on changes in the external magnetic field in association with rotation of the rotating moving body 120, and an arithmetic operation part 113 that calculates the rotation angle θ of the rotating moving body 120 based on the sensor signals that are output by the first and second magnetic sensor parts 111 and 112.

The arithmetic operation part 113 includes an A/D (analog-digital) conversion part 114 that converts analog signals (sensor signals) that are output by the first and second magnetic sensor parts 111 and 112 to digital signals and an arithmetic processing part 115 that performs arithmetic operation on the digital signals that are digital-converted by the A/D conversion part 114 to calculate the rotation angle θ.

The first and second magnetic sensor parts 111 and 112 each include at least one magnetic detection element and may include a pair of magnetic detection elements connected in series. In such a case, the first and second magnetic sensor parts 111 and 112 each have a Wheatstone bridge circuit including a pair of magnetic detection elements connected in series.

As shown in FIG. 8, a Wheatstone bridge circuit 111a that is possessed by the first magnetic sensor part 111 includes a power-supply port V1, a ground port G1, two output ports E11 and E12, a first pair of magnetic detection elements R11 and R12 connected in series, and a second pair of magnetic detection elements R13 and R1 connected in series. One end of each of the magnetic detection elements R11 and R13 are connected to the power-supply port V1. The other end of the magnetic detection element R11 is connected to one end of the magnetic detection element R12 and the output port E11.

The other end of the magnetic detection element R13 is connected to one end of the magnetic detection element R14 and the output port E12. The other ends of the magnetic detection elements R12 and R14 are connected to the ground port G1. A power-supply voltage of a predetermined magnitude is applied to the power-supply port V1, and the ground port G1 is connected to the ground.

As shown in FIG. 9, a Wheatstone bridge circuit 112a that is possessed by the second magnetic sensor part 112 has the same configuration as the Wheatstone bridge circuit 111a of the first magnetic sensor part 111, and includes a power-supply port V2, a ground port G2, two output ports E21 and E22, a first pair of magnetic detection elements R21 and R22 connected in series, and a second pair of magnetic detection elements R23 and R24 connected in series. One end of each of the magnetic detection elements R21 and R23 is connected to the power-supply port V2. The other end of the magnetic detection element R21 is connected to one end of the magnetic detection element R22 and the output port E21. The other end of the magnetic detection element R23 is connected to one end of the magnetic detection element R24 and the output port E22. The other ends of the magnetic detection elements R22 and R24 are connected to the ground port G2. A power-supply voltage of a predetermined magnitude is applied to the power-supply port V2, and the ground port G2 is connected to the ground.

In this embodiment, the magnetoresistive effect element 1 according to this embodiment (see FIGS. 1 to 3) is used as all magnetic detection elements R11 to R14 and R21 to R24 included in the Wheatstone bridge circuits 111a and 112a.

In FIGS. 8 and 9, the magnetization directions of the magnetization-fixed layers 22 of the magnetic detection elements R11 to R14 and R21 to R24 are presented by the filled arrows. In the first magnetic sensor part 111, the magnetization directions of the magnetization-fixed layers 22 of the magnetic detection elements R11 to R14 are parallel to a first direction D1, and the magnetization directions of the magnetization-fixed layers 22 of the magnetic detection elements R11 and R14 and the magnetization directions of the magnetization-fixed layers 22 of the magnetic detection elements R12 and R13 are antiparallel to each other. Moreover, in the second magnetic sensor part 112, the magnetization directions of the magnetization-fixed layers 22 of the magnetic detection elements R21 to R24 is parallel to a second direction that is orthogonal to the first direction, and the magnetization directions of the magnetization-fixed layers 22 of the magnetic detection elements R21 and R24 and the magnetization directions of the magnetization-fixed layers 22 of the magnetic detection elements R22 and R23 are antiparallel to each other. In the first and second magnetic sensor parts 111 and 112, the potential differences between the output ports E11 and E12 and the output ports E21 and E22 change according to change in the direction of the magnetic field in association with rotation of the rotating moving body 120, and first and second sensor signals S1 and S2 are output to the arithmetic operation part 113 as signals presenting the intensity of the magnetic field.

A differential detector 116 outputs a signal corresponding to the potential difference between the output ports E11 and E12 to the A/D conversion part 114 as the first sensor signal S1. A differential detector 117 outputs a signal corresponding to the potential difference between the output ports E21 and E22 to the A/D conversion part 114 as the second sensor signal S2.

As shown in FIGS. 8 and 9, the magnetization directions of the magnetization-fixed layers 22 of the magnetic detection elements R11 to R14 in the first magnetic sensor part 111 and the magnetization directions of the magnetization-fixed layers 22 of the magnetic detection elements R21 to R24 in the second magnetic sensor part 112 are orthogonal to each other. In such a case, the first sensor signal S1 has a cosine waveform that is dependent on the rotation angle θ, and the second sensor signal S2 has a sine waveform that is dependent on the rotation angle θ. In this embodiment, the phase of the second sensor signal S2 differs from the phase of the first sensor signal S1 by ¼ of the signal cycle, namely π/2 (90°).

The A/D conversion part 114 converts the first and second sensor signals (analog signals regarding the rotation angle θ) S1 and S2 that are output by the first and second sensor parts 111 and 112 to digital signals, and the digital signals are entered in the arithmetic processing part 115.

The arithmetic processing part 115 performs arithmetic operation on the digital signals that are converted from the analog signals by the A/D conversion part 114 to calculate the rotation angle θ of the rotating moving body 120. The arithmetic processing part 115 is configured by, for example, a microcomputer or the like.

The rotation angle θ of the rotating moving body 120 can be calculated by, for example, the arctangent calculation that is indicated by the following expression.

$$\theta = a\tan(S1/S2)$$

Here, two different values, which are different by 180°, are obtained within the range of 360° as the solution of the above expression for the rotation angle θ. However, from the combinations of positive and negative values of the first sensor signal S1 and the second sensor signals S2, it is possible to determine which of the two solutions of the above expression is the true value of the rotation angle θ. In other words, the rotation angle θ is larger than 0° and smaller than 180° when the first sensor signal S1 has a positive value. The rotation angle θ is larger than 180° and smaller than 360° when the first sensor signal S1 has a negative value. The rotation angle θ is equal to or larger than 0° and smaller than 90° and larger than 270° and equal to or smaller than 360° when the second sensor signal S2 has a positive value. The rotation angle θ is larger than 90° and smaller than 270° when the second sensor signal S2 has a negative value. The arithmetic processing part 115 calculates the rotation angle θ within the range of 360° based on the above expression and the determined combination of positive and negative values of the first sensor signal S1 and the second sensor signal S2.

In the position detection apparatus 100 in this embodiment having the above configuration, as the external magnetic field changes in association with rotation of the rotating moving body 120, the resistance values of the magnetic detection elements R11 to R14 and R21 to R24 of the first and second magnetic sensor parts 111 and 112 change according to the change in the magnetic field, and the first and second sensor signals S1 and S2 are output by the differential detectors 116 and 117 according to the potential differences between the output ports E11, E12, E21, and E22 of the first magnetic sensor part 111 and the second magnetic sensor part 112. Then, the first sensor signal S1 and the second sensor signal S2 that are output by the differential detectors 116 and 117 are converted to digital signals by the A/D conversion part 114. Subsequently, the rotation angle θ of the rotating moving body 120 is calculated by the arithmetic processing part 115.

The embodiment described above is given for easier understanding of the present invention and is not given for restricting the present invention. Therefore, the elements disclosed in the above embodiment are intended to include any design change and equivalents that pertain to the technical scope of the present invention.

In the above embodiment, the magnetoresistive effect element 1 provided with a plurality of magnetoresistive effect laminated bodies 2 and a plurality of lower lead electrodes 31 and upper lead electrodes 32 that the magnetoresistive effect laminated bodies 2 connected in series is described as an example.

However, this mode is not restrictive. For example, the magnetoresistive effect element 1 may be provided with a single magnetoresistive effect laminated body 2 and a pair of lower lead electrode 31 and upper lead electrode 32 for supplying a current to the magnetoresistive effect laminated body 2. In such a case, the antistatic film (conductive film) 6 may be provided to electrically connect the lower lead electrode 31 to another conductive body (for example, a ground terminal, a ground wire, or the like).

In the above embodiment, the magnetic sensor 110 using the magnetoresistive effect element 1 is described as an example. However, this mode is not restrictive. For example, the magnetoresistive effect element 1 according to the above embodiment can be used for various products pertaining to the spintronics field such as magnetic heads, MRAM, spin torque diodes, and spin torque oscillators.

LEGEND

1 . . . Magnetoresistive effect element
2 . . . Magnetoresistive effect laminated body
3 . . . Lead electrode
31 . . . Lower lead electrode
32 . . . Upper lead electrode
6 . . . Antistatic film (Conductive film)
100 . . . Position detection apparatus

The invention claimed is:

1. A magnetoresistive effect element, comprising:
   a magnetoresistive effect laminated body;
   a lower lead electrode and an upper lead electrode for supplying a current to the magnetoresistive effect laminated body; and
   a film that electrically connects the lower lead electrode to another conductive body, wherein
   the lower lead electrode is a laminated body in which at least a first conductive layer and a second conductive layer are laminated in this order, and
   the film includes an oxide of the same type of conductive material as the first conductive layer.

2. The magnetoresistive effect element according to claim 1, wherein the magnetoresistive effect element comprises a plurality of the magnetoresistive effect laminated bodies, a plurality of the lower lead electrodes, a plurality of the upper lead electrodes, which electrically connects the plurality of magnetoresistive effect laminated bodies, wherein the film electrically connects the plurality of lower lead electrodes to each other.

3. The magnetoresistive effect element according to claim 2, wherein the plurality of lower lead electrodes is electrically connected in substantially the entire surface via the film.

4. The magnetoresistive effect element according to claim 1, wherein the resistance value of the film is higher than the resistance value of the magnetoresistive effect laminated body.

5. The magnetoresistive effect element according to claim 1, wherein the magnetoresistive effect laminated body is a TMR laminated body.

6. The magnetoresistive effect element according to claim 1, wherein the film is an antistatic film.

7. The magnetoresistive effect element according to claim 1, wherein
   the magnetoresistive effect laminated body is one of a first pair of magnetoresistive effect laminated bodies, and the magnetoresistive effect element includes a second pair of magnetoresistive effect laminated bodies, and the lower lead electrode is a first lower lead electrode, and the magnetoresistive effect element includes a second lower lead electrode,
   each of the lower lead electrodes has a first surface and a second surface, which is opposite to the first surface,
   the first lower lead electrode electrically connects the first pair of magnetoresistive effect laminated bodies,
   the second lower lead electrode electrically connects the second pair of magnetoresistive effect laminated bodies,
   the film electrically connects at least the first lower lead electrode and the second lower lead electrode, and
   at least a part of the film is positioned within a range between the first surface and the second surface in the thickness direction of the first and second lower lead electrodes.

8. The magnetoresistive effect element according to claim 1, wherein the film has a thickness of 50 Å or less.

9. The magnetoresistive effect element according to claim 8, wherein the lower lead electrode has a thickness of 0.3 to 2.0 µm.

10. A position detection apparatus, comprising:
    a magnetic sensor part that outputs a sensor signal based on changes in an external magnetic field in association with movements of a moving body; and
    a position detection part that detects the position of the moving body based on the sensor signal that is output by the magnetic sensor part,
    wherein the magnetic sensor part includes the magnetoresistive effect element according to claim 1.

11. The position detection apparatus according to claim 10, wherein
    the moving body is a rotating moving body that rotates about a predetermined rotation axis, and
    the position detection part detects the rotational position of the rotating moving body based on the sensor signal that is output by the magnetic sensor part.

* * * * *